United States Patent [19]

Jeon

[11] Patent Number: 5,343,088
[45] Date of Patent: Aug. 30, 1994

[54] CHARGE PUMP CIRCUIT FOR A SUBSTRATE VOLTAGE GENERATOR OF A SEMICONDUCTOR MEMORY DEVICE

[75] Inventor: Jun-Young Jeon, Seoul, Rep. of Korea

[73] Assignee: Samsung Electronics Co. Ltd., Suwon, Rep. of Korea

[21] Appl. No.: 38,097

[22] Filed: Mar. 30, 1993

[30] Foreign Application Priority Data

Mar. 30, 1992 [KR] Rep. of Korea ............... 5285/1992

[51] Int. Cl.⁵ ............................................. H03K 3/01
[52] U.S. Cl. ........................... 307/296.2; 307/296.5; 307/296.8
[58] Field of Search ............... 307/296.2, 296.4, 296.5, 307/296.8

[56] References Cited

U.S. PATENT DOCUMENTS

| | | | |
|---|---|---|---|
| 4,403,158 | 9/1983 | Slemmer | 307/296.2 |
| 4,742,250 | 5/1988 | Tobita | 307/296.2 |
| 4,843,256 | 6/1989 | Scade et al. | 307/296.2 |
| 5,126,590 | 6/1992 | Chern | 307/296.2 |
| 5,140,182 | 8/1992 | Ichimura | 307/296.5 |
| 5,157,278 | 10/1992 | Min et al. | 307/296.8 |
| 5,196,996 | 3/1993 | Oh | 307/296.2 |
| 5,202,588 | 4/1993 | Matsuo et al. | 307/296.8 |
| 5,266,842 | 11/1993 | Park | 307/296.2 |

Primary Examiner—Timothy P. Callahan
Assistant Examiner—Tuan T. Lam
Attorney, Agent, or Firm—Cushman, Darby & Cushman

[57] ABSTRACT

A charge pump circuit for a substrate voltage bias generator. The charge pump circuit generates a negative substrate bias voltage to a semiconductor substrate by performing a charge pumping operation twice during a clock cycle. Additional pumping capacitors are provided to prevent discharging of the substrate bias voltage to ground during transistor switching operations. The transistor switching provides the necessary charge pumping operations within the charge pumping circuit. This circuit provides increased charge pump efficiency and lower stand-by current than conventional charge pump circuits.

12 Claims, 6 Drawing Sheets

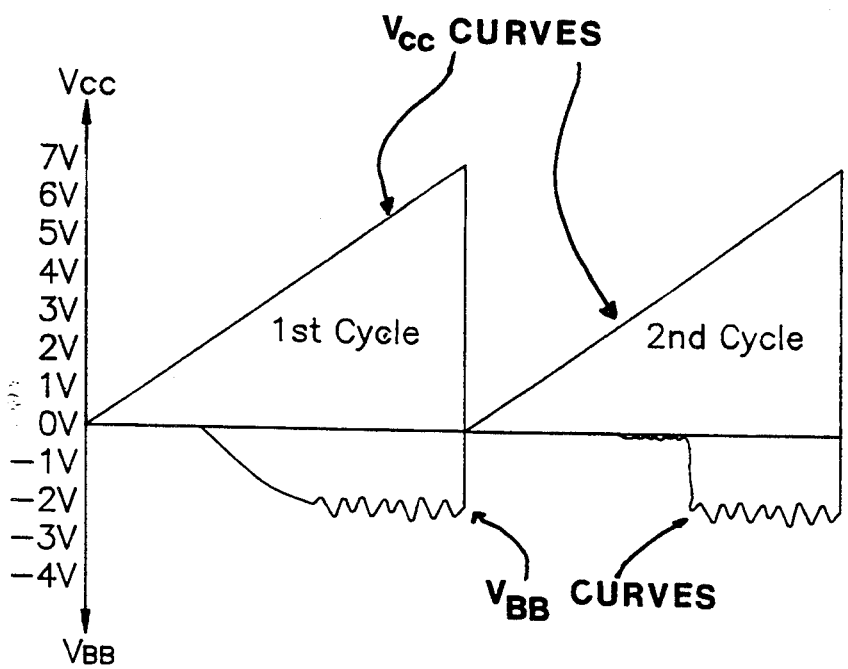
FIG. 6 (PRIOR ART)
FIG. 2A
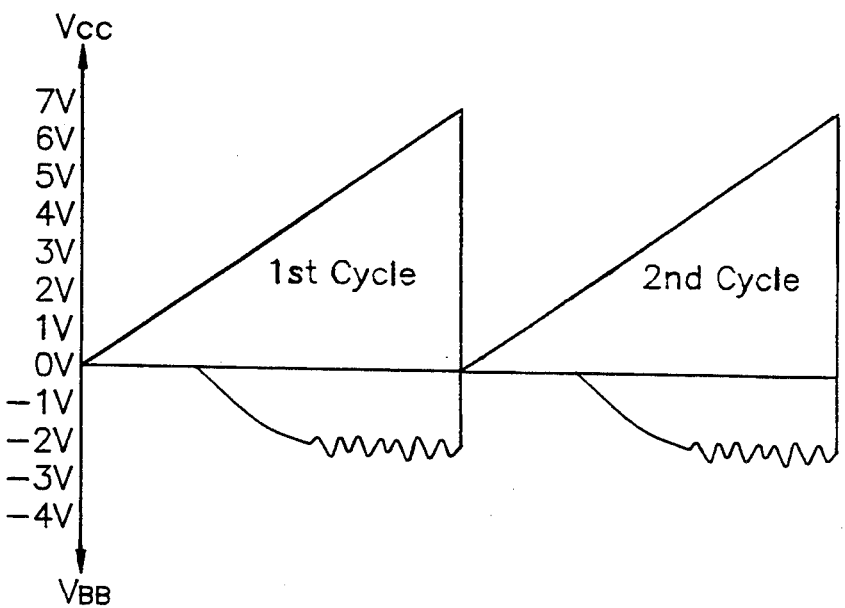
FIG. 7

CHARGE PUMP CIRCUIT FOR A SUBSTRATE VOLTAGE GENERATOR OF A SEMICONDUCTOR MEMORY DEVICE

BACKGROUND OF THE INVENTION

1. Field of the Invention

The present invention relates to a substrate voltage generator in a semiconductor memory device, and more particularly to a charge pump circuit of the substrate voltage generator.

2. Description of the Related Art

All MOS memory architectures on occasion use on-chip voltage generation. While any voltage between ground and the power supply is available on a memory chip, it is also possible to generate on the chip voltages that are below ground and above the power supply value.

The most common on-chip voltage generation in MOS memories is back-bias voltage generation. Early MOS RAMs used a power supply which provided a negative voltage bias to the substrate. On-chip back-bias generation has replaced one of these power supplies in many cases.

The most important advantage of the on-chip substrate voltage generator was the reduced probability of localized forward biasing of junctions. Such forward biasing injects electrons into the substrate leading to dynamic circuit problems and, in memory devices, for example, reduced refresh times due to a collection of electrons beneath the memory storage capacitor plate for stored 'ones'.

Speed and power characteristics also improve when an on-chip substrate voltage generator is used because transistors operate in a flatter part of the body-effect curve and so lose less drive capability as their sources rise and because the lower junction capacitance reduces the load.

Thus, the variation of a threshold voltage caused by the body effect of a transistor is minimized and the punch-through voltage is increased.

Another advantage is that the specific bit-line capacitance (Cb/Cs ratio) improves because junction capacitances contribute more to bit line capacitance (Cb) than to the total storage capacitance (Cs) so that a differential signal to sense amplifiers will increase.

Therefore, if a constant negative voltage is supplied to the substrate by the use of the substrate voltage generator, the performance of the memory chip is improved.

A conventional substrate voltage generator is illustrated in FIG. 1. The substrate voltage generator of FIG. 1 includes an oscillator 1, a driver 2, a charge pump circuit 3 and a detector 4.

Because an output signal Φen from detector 4 is applied to oscillator 1 by way of a feedback loop (as shown), oscillator 1 is only operational when a detected substrate voltage $V_{BB}$ from terminal $V_{BB}$, which is coupled to a semiconductor substrate (not shown), does not maintain a constant negative voltage.

Driver 2 supplies rectangular wave signal 9 to charge pump capacitor 5 in charge pump circuit 3 derived from an alternating current (ac) signal 8 generated from oscillator 1.

Charge pump circuit 3 is connected to substrate voltage $V_{BB}$ and includes one charge pump capacitor 5, and two diodes 6, and 7. The voltage level to which charge pump capacitor 5 is charged is determined by the amplitude of the rectangular wave signal 9 supplied thereto.

When rectangular wave signal 9 (shown as clock signal CLK) is at logic "high", diode $D_{GND}$ is turned on and charges thereto are discharged to ground.

Conversely, when rectangular wave signal 9 (clock CLK) is at logic "low", diode $D_{SUB}$ is turned on and charges thereto are transferred away from the substrate voltage terminal. As a result, the substrate bias voltage $V_{BB}$ goes to a negative voltage level.

A more complex conventional circuit diagram for a charge pump circuit, operated on by CLK1 to CLK4, is shown in FIG. 2A and consists of P-channel MOS transistors. Charge pump circuit 3' shown in FIG. 2A can be substituted for the simpler charge pump circuit 3 of FIG. 1.

Charge pump circuit 3' is coupled to a driver circuit 2' (see FIG. 2B), which driver circuit 2' generates additional clock signals CLK1–CLK4 (derived from clock signal (CLK)) to be received by charge pump circuit 3'.

Driver circuit 2' may receive clock signal CLK from a driver 2, which driver 2 generates a rectangular wave (clock) signal in response to an oscillator (ac) signal substantially as provided in block form in FIG. 1. It should be readily apparent, however, that any and all equivalent clocking schemes may be equally appropriate and substituted for the one indicated. FIG. 3 shows a timing chart for the conventional charge pump circuit shown in FIG. 2A.

The operation of charge pump circuit 3' will now be described with reference to FIG. 2A and FIG. 3. For descriptive convenience, it is assumed that the MOS transistors in FIG. 2A are ideal transistors, and therefore, the threshold voltages of these MOS transistors will not be considered.

Clocks CLK1 and CLK2 are transmitted from driver circuit 2' so as to be in-phase but so as to have different pulse widths from one another.

Similarly, clocks CLK3 and CLK4 are also provided from driver circuit 2' and have the same phase but different pulse widths from one another.

In addition, the phase of clocks CLK1 and CLK2 is such that the phase is opposite from the phase of clocks CLK3 and CLK4. As a result, charge pump circuit 3' of FIG. 2A is capable of performing pump operations twice during a complete clock cycle.

When clocks CLK1 and CLK2 become logic "high" corresponding to high power voltage $V_{CC}$ level, then clocks CLK3 and CLK4 become logic "low" with ground voltage $V_{SS}$ level—after the lapse of a predetermined time.

At such time, voltages at nodes c and d are set to a negative power voltage $-V_{CC}$ level by third and fourth pump capacitors 13 and 14. In turn, third and fifth transistors 23 and 25 turn on.

Charges which flowed to node b from substrate voltage terminal $V_{BB}$ during a previous half period are grounded through third transistor 23.

Similarly, at node c, because charges flow from substrate voltage terminal $V_{BB}$ through fifth transistor 25, which is turned on, the voltage level at substrate voltage terminal $V_{BB}$ drops to a more negative voltage level.

Because the voltage at node b exceeds ground voltage $V_{BB}$ level, sixth transistor 26 turns off so as to electrically isolate substrate voltage terminal $V_{BB}$ from ground.

When clocks CLK3 and CLK4 become logic "high", clocks CLK1 and CLK2 go logic "low" because nodes a and b are lowered to negative power voltage $-V_{CC}$ level by first and second pump capacitors 11 and 12. In turn, second and sixth transistors 22 and 26 turn on.

Charges which flowed to node c from substrate voltage terminal $V_{BB}$ during a previous half clock cycle are grounded through sixth transistor 26.

Similarly, as charges flow to node b through second transistor 22 which is turned on, substrate voltage terminal $V_{BB}$ drops to a negative voltage.

At this point in time, because the voltage at node c exceeds ground voltage $V_{SS}$ level, third transistor 23 turns off to electrically isolate substrate voltage terminal $V_{BB}$ from ground.

In this circuit configuration, it is important that neither second and third transistors 22, 23 nor fifth and sixth transistors 25, 26 be simultaneously turned on.

When both second and third transistors 22, 23 or fifth and sixth transistors 25, 26 are simultaneously turned on, because substrate voltage terminal $V_{BB}$ is connected to ground, substrate voltage terminal $V_{BB}$ cannot be made to drop to a negative voltage level.

Consequently, the fact that second and third transistors 22, 23 (or, fifth and sixth transistors 25, 26) are such that they can be simultaneously switched on, is a serious drawback.

More specifically, as power voltage $V_{CC}$ level drops in response to a powering-up, the power of the memory chip is turned on to raise the power voltage $V_{CC}$ level. At this point, the voltage at nodes a to d drops to a negative power voltage $-V_{CC}$ level in response to first to fourth pump capacitors 11 to 14.

In turn, because the voltage level at substrate voltage terminal $V_{BB}$ has not been set to a negative voltage level, first and fourth transistors 21 and 24, having their respective gates connected to substrate voltage terminal $V_{BB}$, are necessarily turned off.

In addition, second and sixth transistors 22 and 26 are turned on by voltage levels at nodes a and b. Similarly, third and fifth transistors 23 and 25 are turned on by voltage levels at nodes c and d.

Because second and third transistors 22 and 23, and fifth and sixth transistors 25 and 26, are simultaneously turned on, substrate voltage terminal $V_{BB}$ becomes grounded; and, the voltage thereto cannot be made negative, as intended.

To overcome this initial drawback, a power voltage $V_{CC}$ level of considerable magnitude must necessarily be applied.

However, when substrate voltage terminal $V_{BB}$ is eventually set to a negative voltage level using a high magnitude power voltage $V_{CC}$ level, an oscillator 1 connected thereto must necessarily also operate at this high power voltage level. As a result, standby current is abruptly increased.

FIG. 6 shows a set up characteristic curve for the substrate voltage terminal $V_{BB}$ using the charge pump circuit of FIG. 2A where power voltage $V_{CC}$ level is successively raised and then dropped.

During the first cycle, where power voltage $V_{CC}$ level is raised, substrate voltage terminal $V_{BB}$ goes to a negative voltage level at an input power voltage $V_{CC}$ level of about 2 volts.

However, in a subsequent cycle, as power voltage $V_{CC}$ level is raised from 0 volts, substrate voltage terminal $V_{BB}$ goes to a negative voltage level at an input power voltage $V_{CC}$ level of 4 volts or greater. As such, it is clear that because substrate voltage terminal $V_{BB}$ goes negative for high voltage levels of $V_{CC}$, stand-by current increases.

Furthermore, in connection with charge pump circuit 3' of FIG. 2A, because the potential at nodes b and c connected to third and sixth transistors 23 and 26 is not constant, charge pumping efficiency is significantly lowered.

Stated differently, as charges are passed to ground from substrate voltage terminal $V_{BB}$, because the potential at nodes b and c cannot be maintained at a negative power voltage $-V_{CC}$ level, but instead, the respective node potential go to levels which exceed the negative power voltage level of $-V_{CC}$, sufficient and rapid discharge is not possible and charge pumping efficiency is degraded.

SUMMARY OF THE INVENTION

Accordingly, it is an object of the present invention to provide a charge pump circuit which minimizes stand-by current in a substrate voltage generator.

It is another object of the present invention to provide a charge pump circuit having a fast set-up operation of a substrate voltage back-bias as a power voltage applied to a charge pump circuit is successively raised and dropped.

It is a further object of the present invention to provide a charge pump circuit for improving reliability of operation for first and subsequent substrate voltage cycles.

It is a still further object of the present invention to provide a charge pump circuit for increasing the charge pumping efficiency.

In accordance with one aspect of the present invention, a substrate voltage terminal of the charge pump circuit is not connected to the gate of a MOS transistor, and the charge pump circuit has additional pump capacitors.

BRIEF DESCRIPTION OF THE DRAWINGS

The above and other objects, advantages and features of the present invention will be more apparent from the following detailed description when taken in conjunction with the accompanying drawings, in which.

DETAILED DESCRIPTION OF THE PREFERRED EMBODIMENT

Figure 4:
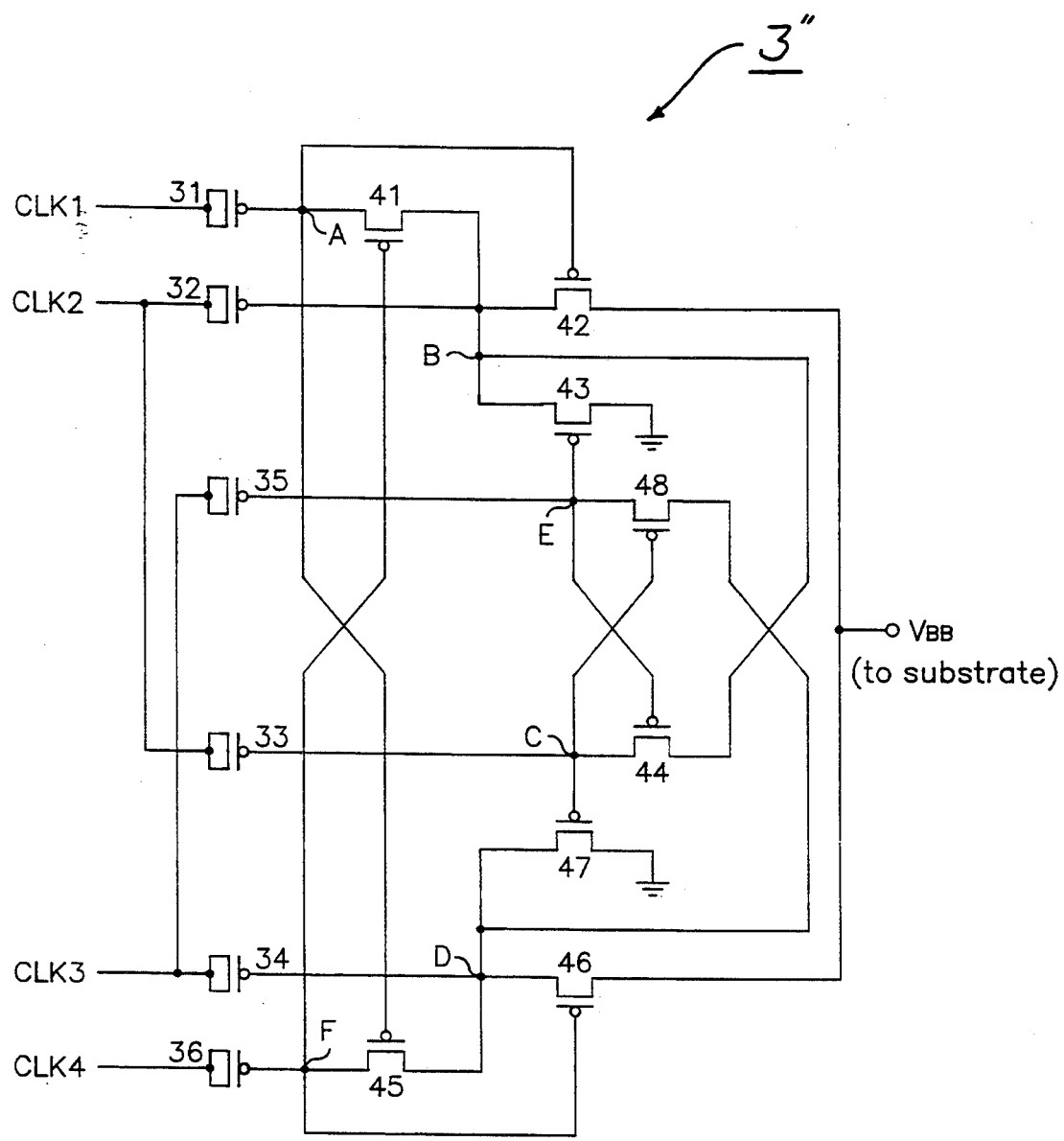
FIG. 4 is a circuit diagram of a charge pump circuit embodying the present invention.

An improved charge pump circuit 3' for use in a substrate voltage generator of a semiconductor memory device is shown in FIG. 4. Charge pump circuit 3' overcomes the drawbacks of charge pump circuit 3', described above in connection with FIG. 2A, and can be easily substituted therefor.

In the preferred embodiment, to be discussed below in connection with FIG. 4, threshold of respective transistors will not be considered in any detail as transistor operation is believed conventional and therefore unnecessary for a clear understanding of the present invention.

First pump capacitor 31 is shown having one terminal connected to clock CLK1. Second pump capacitor 32 is shown having one terminal connected to clock CLK2, and which clock has a smaller pulse width than clock CLK1 but is in-phase therewith.

Third pump capacitor 33 is connected in parallel with second pump capacitor 32, and has one of its terminals connected to clock CLK2.

Fourth pump capacitor B4 has one terminal connected to clock CLK3 which has a smaller pulse width than clock CLK1 and a different phase therewith.

Fifth pump capacitor 35 is connected in parallel with fourth pump capacitor 34, and has one of its terminals connected to clock CLK3.

Sixth pump capacitor 36 has one terminal connected to clock CLK4 which has a larger pulse width than clock CLK3 but is in-phase therewith.

Figure 1:
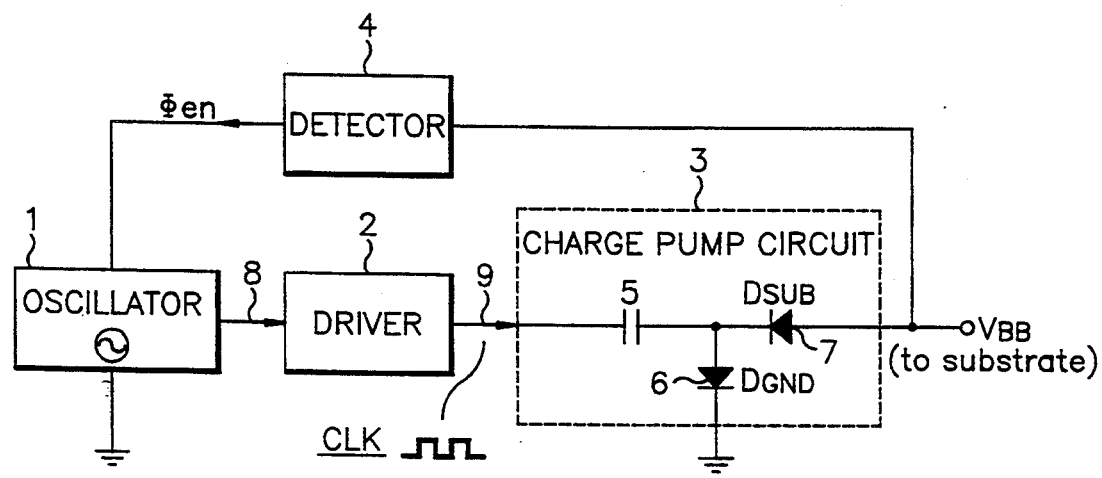
FIG. 1 is a block diagram of a general substrate voltage generator.
Figure 2A:
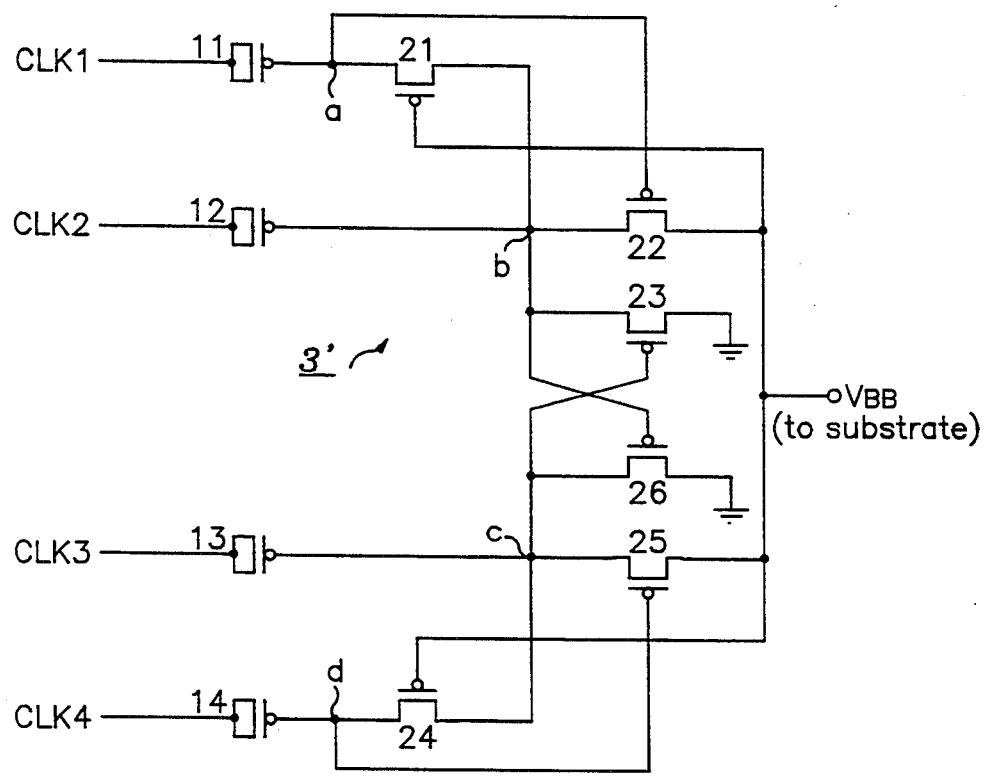
FIG. 2A is a circuit diagram illustrating a conventional charge pump circuit.
Figure 2B:
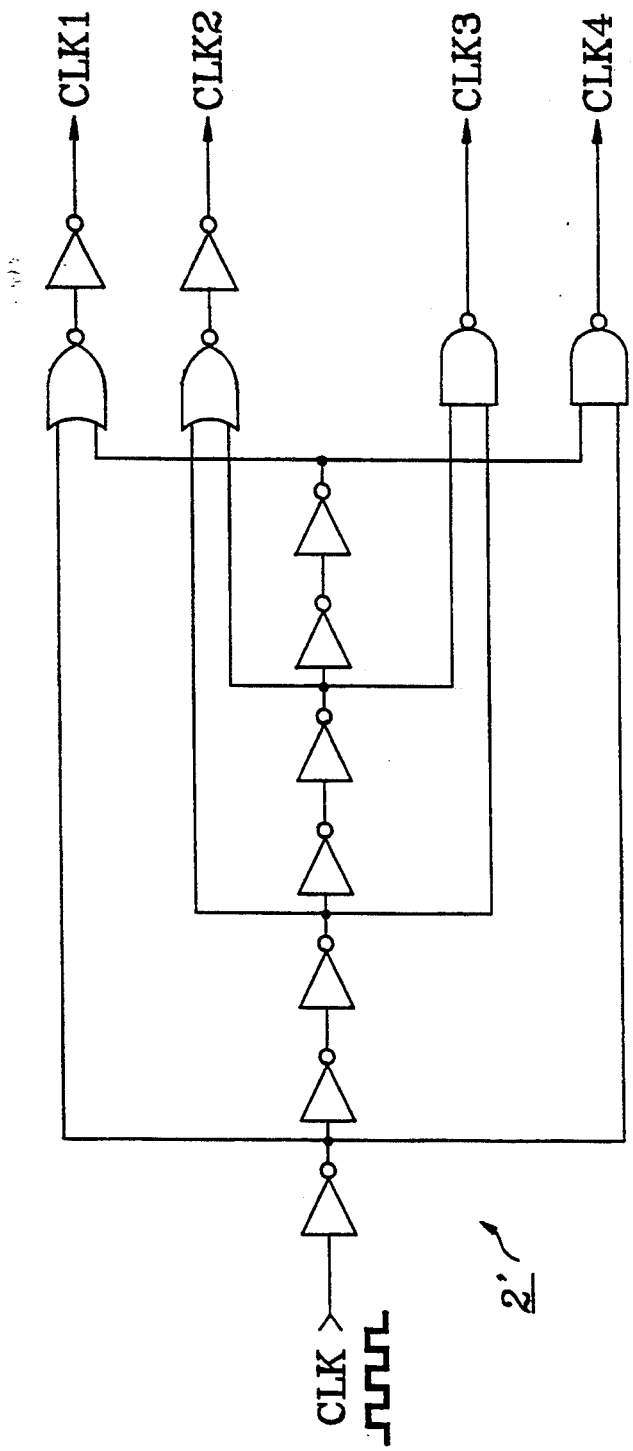
FIG. 2B is a circuit diagram of a driver circuit for generating clock signals CLK1-CLK4 from clock signal CLK.
Figure 3:
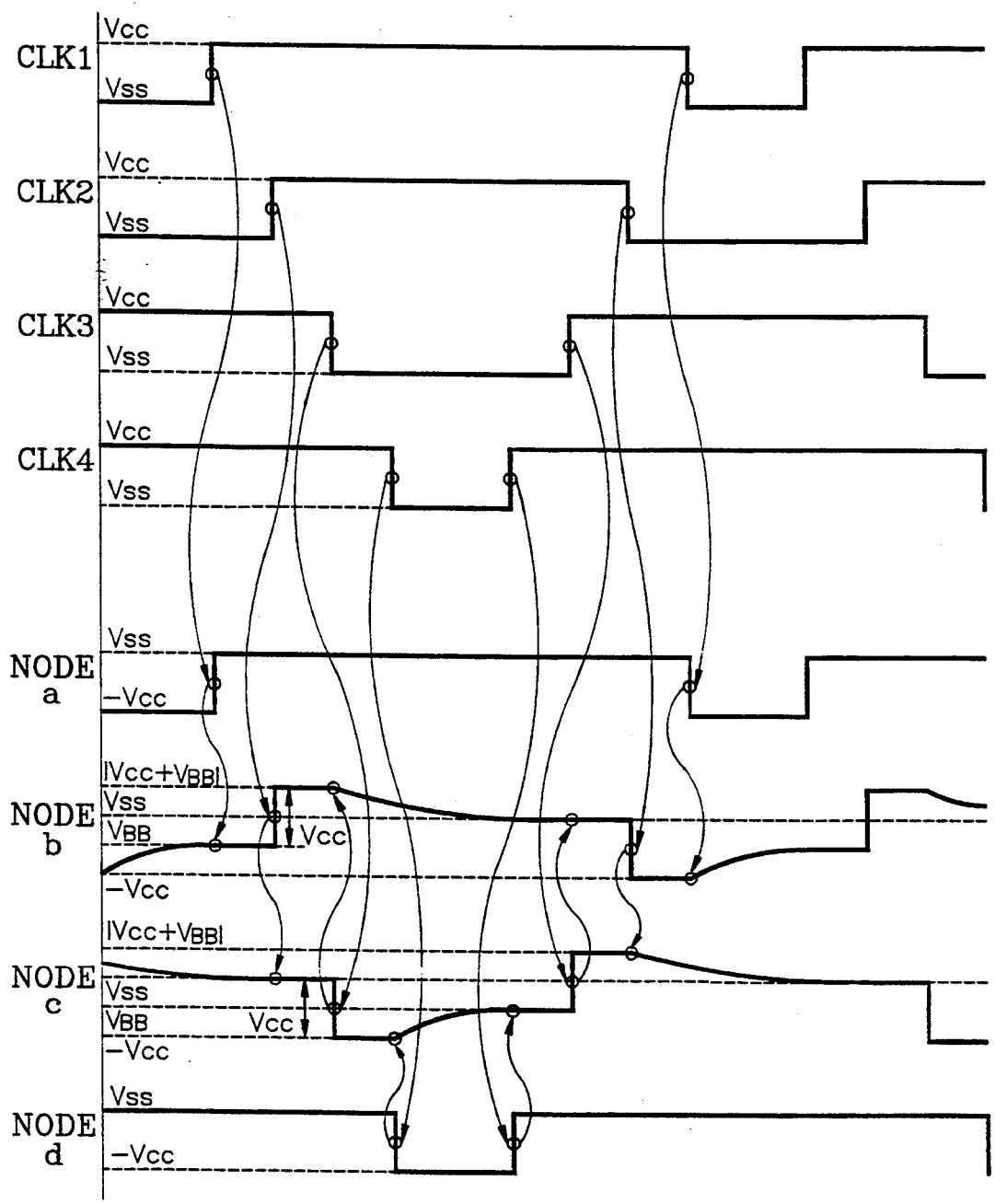
FIG. 3 is a timing chart illustrating the operation of FIG. 2A.

Externally provided clock signals CLK1 to CLK4 are derived substantially as described above in connection with driver circuit 2' of FIG. 2B.

First to sixth pump capacitors 31 to 36 each are formed from like transistor technology, each having a respective other terminal connected to one of nodes A to F associated therewith.

First transistor 41 is used to connect nodes A and B through its channel, with its gate being connected to node F.

Second transistor 42 has its channel connected between node B and substrate voltage terminal $V_{BB}$, its gate being connected to node A.

Third transistor 43 has its the channel connected between node B and ground, its gate shown connected to node E.

Fourth transistor 44 has its channel connected between nodes C and B and its gate to node E.

Fifth transistor 45 has its channel connected between nodes F and D and its gate connected to node A.

Sixth transistor 46 has its channel connected between node D and substrate voltage terminal $V_{BB}$, its gate shown connected to node F.

Seventh transistor 47 has its channel connected between node D and ground, and its gate connected to node C.

Eighth transistor 48 has its channel connected between nodes E and D, and its gate connected to node C.

Second and sixth transistors 42 and 46 serve to transfer charges from substrate voltage terminal $V_{BB}$ to nodes within charge pump circuit 3'.

Similarly, third and seventh transistors 43 and 47 serve to transfer charges from substrate B5 voltage terminal $V_{BB}$ to ground.

First and fifth transistors 41 and 45 cause second and sixth transistors 42 and 46 to turn off by transferring charges at nodes B and D to nodes A and F respectively.

In turn, nodes B and D become electrically isolated, i.e. cut off, from substrate voltage terminal $V_{BB}$.

Similarly, fourth and eighth transistors 44 and 48 cause third and seventh transistors 43 and 47 to turn off by transferring charges at nodes B and D to nodes C and E, thus disconnecting, i.e., electrically isolating, nodes B and D from ground.

Figure 5:
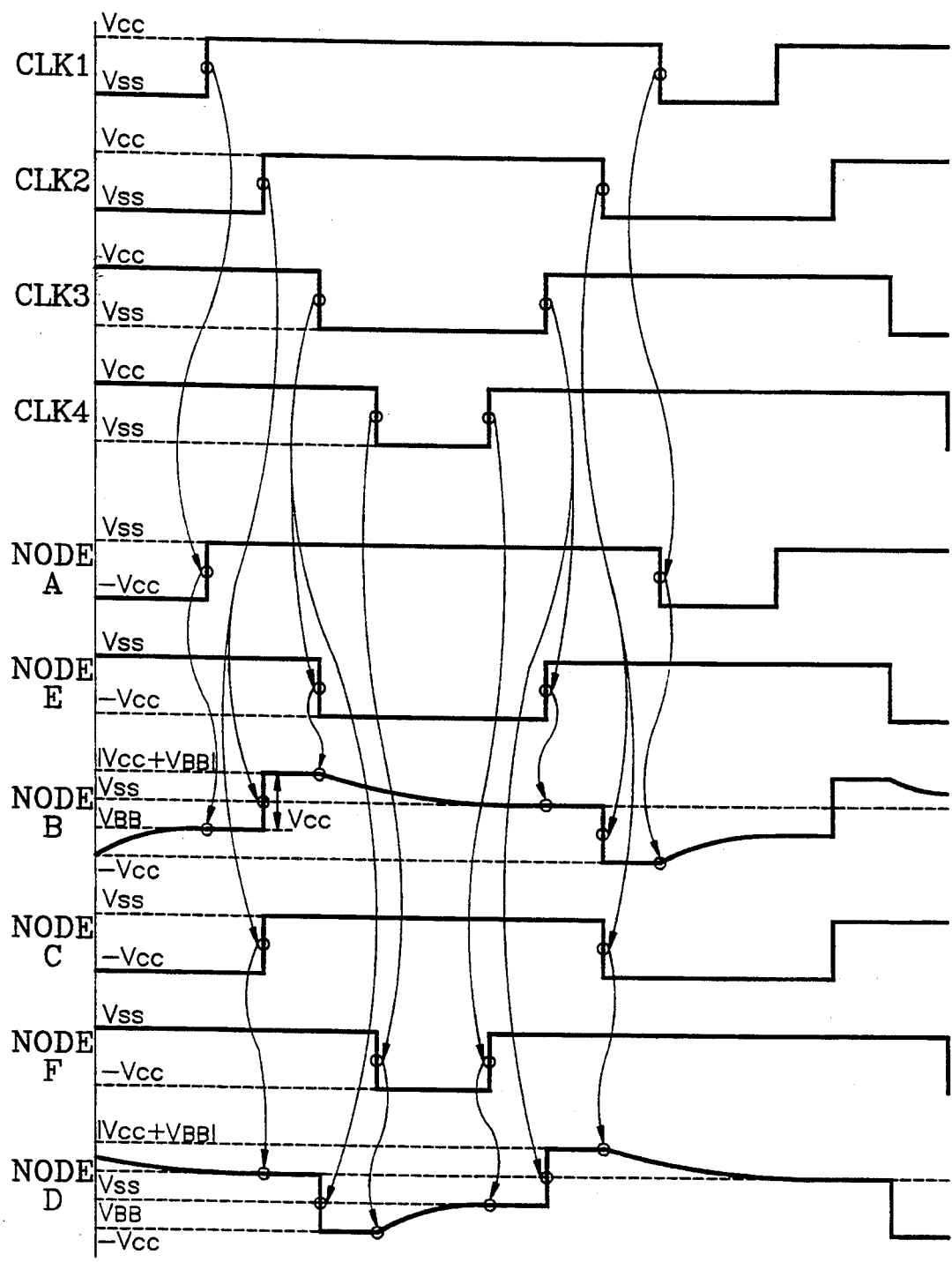
FIG. 5 is a timing chart illustrating the operation of FIG. 4.

FIG. 5 shows an operational timing chart for the charge pump circuit in FIG. 4. The operation of the charge pump circuit 3' embodying the present invention, will now be described with reference to FIGS. 4 and 5.

As explained above, clocks CLK1 and CLK2 are provided which are in-phase but which have different pulse widths relative to one another.

Likewise, clocks CLK3 and CLK4 are in-phase but also have different pulse widths relative to one another.

The phase of clocks CLK1 and CLK2 is also opposite to the phase of clocks CLK3 and CLK4. As a result, charge pump circuit 3' performs pump operations twice during a complete clock cycle.

When clocks CLK1 and CLK2 are logic "high" corresponding to a power voltage $V_{CC}$ level, clocks CLK3 and CLK4 become logic "low", i.e., ground voltage $V_{SS}$ level, after the lapse of a predetermined period of time.

At such time, the voltages at nodes D, E and F are forced to a negative power voltage $-V_{CC}$ level by fourth, fifth and sixth pump capacitors 34, 35 and 36. In turn, third, fourth and sixth transistors 41, 43, 44 and 46 turn on.

Charges which flowed to node B from substrate voltage terminal $V_{BB}$, during a previous half clock cycle, are discharged to ground through third transistor 43.

Because charges from substrate voltage terminal $V_{BB}$ are also transferred to node A through transistor 41, the voltage at node A is maintained higher than ground voltage $V_{SS}$ level. Accordingly, second transistor 42 turns off and node B becomes electrically disconnected from substrate voltage terminal $V_{BB}$.

Furthermore, because charges from substrate voltage terminal $V_{BB}$ are also transferred to node C through transistor 44, the voltage at node C is maintained higher than the ground voltage $V_{SS}$ level.

Accordingly, seventh transistor 47 turns off and node D is disconnected from substrate voltage terminal $V_{BB}$. In turn, eighth transistor 48 turns off and the voltage at node E is maintained higher than the negative power voltage $-V_{CC}$ level.

At this point in time, charges from substrate voltage terminal $V_{BB}$ are transferred to node D through sixth transistor 46 which turns on. As a result, substrate voltage terminal $V_{BB}$ drops to a negative voltage.

When clocks CLK3 and CLK4 become logic "high", i.e., power voltage $V_{CC}$ level, and clocks CLK1 and CLK2 become logic "low", i.e., ground voltage $V_{SS}$ level, then nodes A, B and C assume negative power voltage $-V_{CC}$ level in response to first, second and third pump capacitors 31, 32 and 33. In turn, second, fifth, seventh and eighth transistors 42, 45, 47 and 48 all turn on.

Charges which flowed to node D from substrate voltage terminal $V_{BB}$ during a previous half clock cycle are discharged to ground through seventh transistor 47.

Because charges from substrate voltage terminal $V_{BB}$ are transferred to node F through transistor 45, the voltage level at node F is maintained higher than ground voltage $V_{SS}$ level—by way of fifth transistor 45.

Accordingly, sixth transistor 46 turns off and node D is electrically isolated from substrate voltage terminal $V_{BB}$, Because charges from substrate voltage terminal $V_{BB}$ are also transferred to node E through eighth transistor 48, the voltage level at node E is maintained higher than ground voltage $V_{SS}$ level.

Accordingly, fourth transistor 44 turns off such that the voltage level at node C is maintained higher than negative power voltage $-V_{CC}$ level.

At this point in time, charges from substrate voltage terminal $V_{BB}$ are transferred to node B through second transistor 42 which turns on. As a result, the voltage at substrate voltage terminal $V_{BB}$ drops to a negative voltage level.

With respect to charge pump circuit 3" in FIG.4, because at no point in the circuit does substrate voltage terminal $V_{BB}$ connect to the gate of a transistor, substrate voltage terminal $V_{BB}$ is not permitted to couple directly to ground. Thus, the drawback of conventional charge pump circuits 3', as explained above, is overcome.

Thus, when an input power voltage $V_{CC}$ level is successively raised and dropped causing nodes A to F to drop to a negative voltage level in response to pump capacitors 31–36, then because nodes A and F are charged to a ground voltage level by receiving charges from ground through fifth and first transistors 45 and 41, second and sixth transistors 42 and 46 shall turn off. Consequently, nodes B and D are instantaneously disconnected from substrate voltage terminal $V_{BB}$.

In addition, because substrate voltage terminal $V_{BB}$ is electrically isolated from ground, substrate voltage terminal $V_{BB}$ rapidly becomes set to a negative voltage level even with an input power voltage $V_{CC}$ level that is low in magnitude.

In addition, because nodes B and D are in a latched state through fourth and eighth transistors 44 and 48, charges at nodes B and D can be transferred to nodes C and E respectively. In turn, seventh and third transistors 47 and 43 shall complementarily turn off. Consequently, nodes B and D will also become electrically isolated from ground.

In response to third and fifth pump capacitors 33 and 35, the gate voltages at third and seventh transistors 43 and 47 are maintained at negative power voltage $-V_{CC}$ level to allow charges at nodes B and D to be rapidly discharged to ground voltage through third and seventh transistors 43 and 47. As a result, charge pumping efficiency should increase in comparison with conventional charge pump circuits.

Similarly, because the number of operations of the charge pump circuit 3" that are necessary to set-up a negative voltage level at substrate voltage terminal $V_{BB}$ decreases, stand-by current is also significantly reduced when compared with the device of FIG. 2A.

Figure 7:
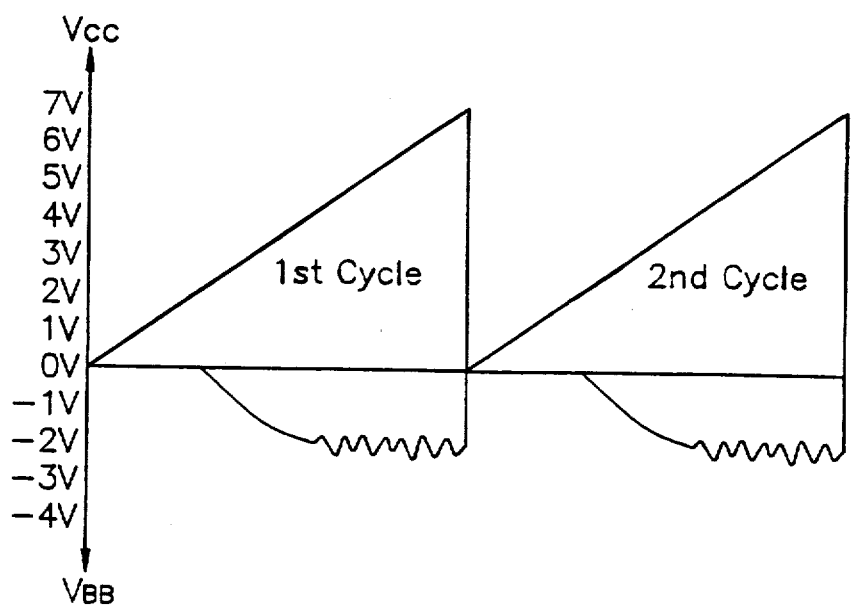
FIG. 7 is a graph illustrating the set-up characteristic of a substrate voltage of FIG. 4.

As illustrated in FIG.7, as input power voltage $V_{CC}$ level is successively raised and then dropped during a first cycle, a substrate bias voltage $V_{BB}$ (fed to substrate voltage terminal $V_{BB}$) shall become set to a negative voltage level at a power voltage $V_{CC}$ level. This negative voltage characteristic curve is consistently provided for each second and subsequent cycle.

While the invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A charge pump circuit in a substrate bias voltage generator for pumping a bias charge to a voltage output terminal twice during a complete clock cycle so as to maintain a substantially constant negative voltage level thereto, said charge pump circuit comprising:

first and second pump capacitors for respectively receiving first and second in-phase rectangular wave signals, of different pulse width from one another, at a respective end thereof;

third and fourth pump capacitors for respectively receiving in-phase third and fourth rectangular wave signals, of different pulse width from one another, at a respective end thereof;

a first transistor having a channel connected between a first pumping node and the voltage output terminal, and a control terminal connected to said first pump capacitor, said first pumping node being electrically coupled to said second pumping capacitor;

a second transistor connected between said first pumping node and a ground voltage terminal;

a third transistor having its channel connected between a second pumping node and said voltage output terminal, and a control terminal connected to said fourth pump capacitor, said second pumping node being electrically coupled to said third pumping capacitor;

a fourth transistor connected between said second pumping node and said ground voltage terminal;

first means connected to said first pump capacitor and to said fourth pump capacitor for electrically isolating said first pumping node from said second pumping node;

second means connected to a control terminal of said second transistor and to a control terminal of said fourth transistor for controlling the operation of said second and fourth transistors; and third means connected to said first and second pumping nodes and to said control terminal of said second transistor and to said control terminal of said fourth transistor, for complementarily operating said second and fourth transistors in response to a signal from said second means.

2. The charge pump circuit of claim 1, wherein said first means comprises:

a fifth transistor having both terminals connected between said first pump capacitor and said first pumping node and a control terminal connected to said fourth pump capacitor; and a sixth transistor having both terminals connected between said fourth pump capacitor and said second pumping node and a control terminal connected to said first pump capacitor.

3. The charge pump circuit of claim 1, wherein said second means comprises:

a fifth pump capacitor connected to a control terminal of said second transistor for receiving said third rectangular wave signal; and a sixth pump capacitor connected to a control terminal of said fourth transistor for receiving said second rectangular wave signal.

4. The charge pump circuit of claim 1, wherein said third means comprises:

a seventh transistor having its channel connected between said fifth pump capacitor and said second pumping node, and a control terminal connected to said sixth pump capacitor; and an eighth transistor having its channel connected between said sixth pump capacitor and said first pumping node, and a control terminal connected to said fifth pump capacitor.

5. The charge pump circuit of claim 1, wherein said first to fourth pump capacitors comprise a P-channel MOS transistor.

6. The charge pump circuit of claim 3, wherein said first to sixth pump capacitors comprise a P-channel MOS transistor.

7. The charge pump circuit of claim 1, wherein said first to fourth transistors comprise a P-channel MOS transistor.

8. The charge pump circuit of claim 2, wherein said first to sixth transistors comprise a P-channel MOS transistor.

9. The charge pump circuit of claim 4, wherein said first to eighth transistors comprise a P-channel MOS transistor.

10. A charge pump circuit in a substrate bias voltage generator for pumping a bias charge to a voltage output terminal twice during a complete clock cycle so as to maintain a substantially constant negative voltage level thereto, said charge pump circuit comprising:
   capacitive means for generating first, second, third, and fourth source signals in response to a plurality of different pulse clock signals;
   a first transistor having a channel connected between a first pumping node and the voltage output terminal, and a control terminal connected to said first source signal, said first pumping node being electrically coupled to said second source signal;
   a second transistor connected between said first pumping node and a ground voltage terminal;
   a third transistor having its channel connected between a second pumping node and said voltage output terminal, and a control terminal connected to said fourth source signal, said second pumping node being electrically coupled to said third source signal;
   a fourth transistor connected between said second pumping node and said ground voltage terminal;
   first means connected to said first source signal and to said fourth source signal for electrically isolating said first pumping node from said second pumping node;
   second means connected to a control terminal of said second transistor and a control terminal of said fourth transistor for controlling the operation of said second and fourth transistors; and
   third means connected to said first and second pumping nodes and to said control terminal of said second transistor and said control terminal of said fourth transistor, for complementarily operating said second and fourth transistors in response to a signal from said second means.

11. The charge pump circuit of claim 10, wherein said first means comprises:
   a fifth transistor having both terminals connected between said first source signal and said first pumping node and a control terminal connected to said fourth source signal; and
   a sixth transistor having both terminals connected between said fourth source signal and said second pumping node and a control terminal connected to said first source signal.

12. The charge pump circuit of claim 10, wherein said capacitive means is connected to a driver circuit responsive to a clock signal for generating:
   first and second in-phase rectangular wave signals of different pulse width from one another; and
   third and fourth rectangular wave signals of different pulse width from one another and of opposite phase from said first and second rectangular waves, said capacitive means being responsive to each of said first, second, third and fourth rectangular signals for generating said first source signal, said second source signal, said third source signal and said fourth source signal, respectively.

* * * * *

UNITED STATES PATENT AND TRADEMARK OFFICE
CERTIFICATE OF CORRECTION

Figure 6:
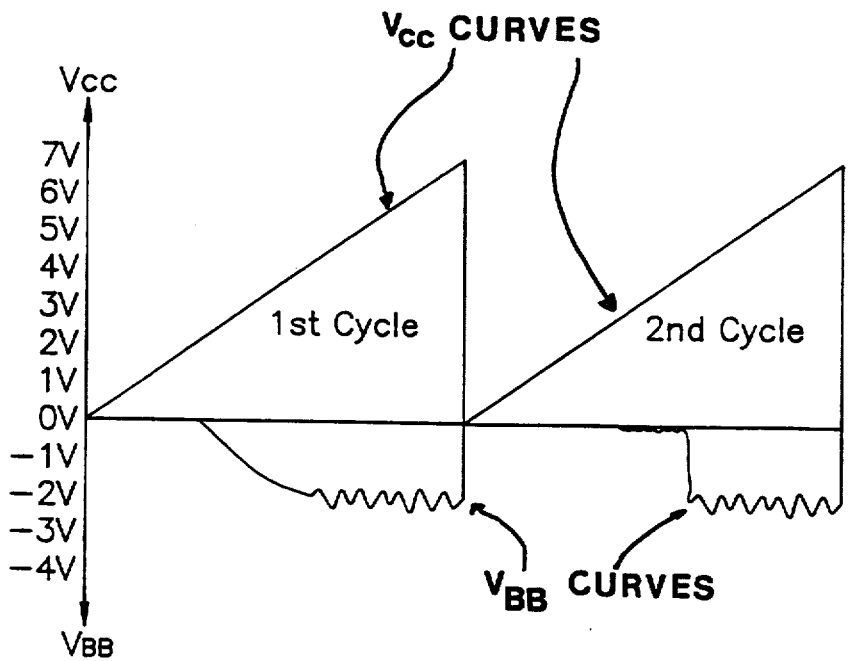
FIG. 6 is a graph illustrating the set-up characteristic of a substrate voltage of FIG. 2A.

PATENT NO.  : 5,343,088
DATED       : August 30, 1994
INVENTOR(S) : Jun-Young JEON It is certified that error appears in the above-indentified patent and that said Letters Patent is hereby corrected as shown below:

Delete drawing sheet 6, and substitute therefor drawing sheet consisting of figures 6 and 7 as shown on attached sheet.

Signed and Sealed this

Fourteenth Day of March, 1995

Attest:

BRUCE LEHMAN

Attesting Officer     Commissioner of Patents and Trademarks